(12) United States Patent
Yang (10) Patent No.: US 7,684,040 B2
(45) Date of Patent: Mar. 23, 2010

(54) OVERLAY MARK AND APPLICATION THEREOF

(75) Inventor: Chin-Cheng Yang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 321 days.

(21) Appl. No.: 11/759,653

(22) Filed: Jun. 7, 2007

(65) Prior Publication Data

US 2008/0304063 A1 Dec. 11, 2008

(51) Int. Cl.
G01B 11/00 (2006.01)
H01L 23/544 (2006.01)
G03F 9/00 (2006.01)
H01L 21/76 (2006.01)

(52) U.S. Cl. .................. 356/401; 257/797; 430/22; 438/401

(58) Field of Classification Search .......... None
See application file for complete search history.

(56) References Cited

U.S. PATENT DOCUMENTS 6,936,931 B2* 8/2005 Baek et al. ............. 257/797
6,937,337 B2* 8/2005 Ausschnitt et al. ......... 356/401
7,288,848 B2* 10/2007 Lee et al. .................. 257/797
7,408,642 B1* 8/2008 DiBiase ..................... 356/401
7,480,892 B2* 1/2009 Chiu et al. .................. 716/21
2002/0166107 A1 11/2002 Capodieci et al.

* cited by examiner

Primary Examiner—Tarifur Chowdhury
Assistant Examiner—Gordon J Stock, Jr.
(74) Attorney, Agent, or Firm—J.C. Patents (57) ABSTRACT

An overlay mark is described, wherein the overlay mark is used for checking the alignment accuracy between a lower layer defined by two exposure steps and a lithography process for defining an upper layer, including a part of the lower layer and a photoresist patter. The part of the lower layer includes two first x-directional, two first y-directional bar-like patterns. The first x-directional and first y-directional bar-like patterns are defined by one exposure step to define a first rectangle. The second x-directional and second y-directional bar-like patterns are defined by another exposure to define a second rectangle, wherein the second rectangle is wider than the first rectangle. The photoresist pattern, which is formed by the lithograph process, is disposed over the part of the lower layer and is surrounded by the bar-like patterns.

22 Claims, 5 Drawing Sheets

OVERLAY MARK AND APPLICATION THEREOF

BACKGROUND OF THE INVENTION

1. Field of Invention

The present invention relates to an overlay park used in an IC fabrication process; more particularly, the present invention relates an overlay mark for checking the alignment accuracy between a lower layer defined by two exposure steps and a lithograph process for defining an upper layer, and its application in checking alignment accuracy.

2. Description of Related Art

As the line width in an IC fabrication process continues to reduce, the control of the critical dimension of a device becomes very important. When patterns of different dispositions and configurations are formed in two regions on a single wafer, it is necessary to perform two exposures to the photoresist layers of the two regions under different exposure conditions to achieve the designated critical dimension at each region. Further, two exposure steps can achieve the desired result as the pitch of the predetermined pattern is smaller than the resolution of a single exposure.

To check the alignment accuracy between the two patterns of a single wafer layer defined by two exposure steps and a subsequent wafer layer, an overlay mark is typically formed on the subsequent wafer layer according to the conventional practice as described in the process below.

Figure 1:
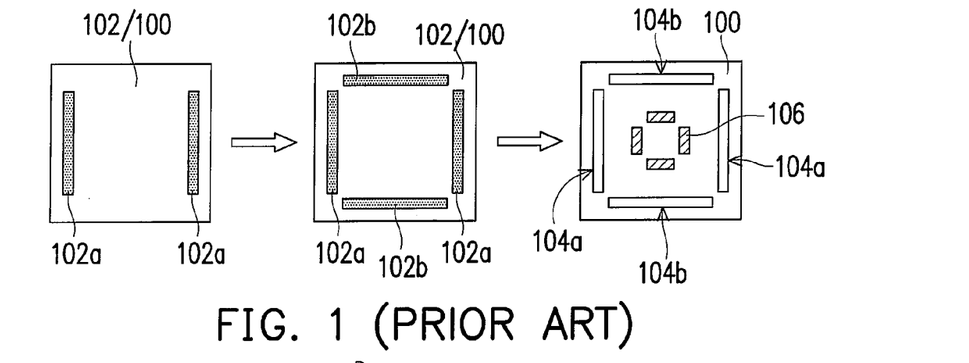
FIG. 1 is a schematic diagram illustrating the fabrication method of an overlay mark according to the prior art.

As shown in FIG. 1, when a mask is used to perform a first exposure on a die region, two Y-directional bar-like exposure regions 102a are concurrently formed in a positive photoresist layer 102 above the lower the wafer layer 100 of the non-die region. Then, another mask is used for a second exposure, and two X-directional bar-like exposure regions 102b are concurrently formed in the positive photoresist layer 102. For simplicity purposes, the mask, the die region, the non-die region and the upper wafer layer are not illustrated.

The photoresist in each exposure region 102a, 102b and the exposure region in the die region are removed in the subsequent development process. Hence, in the etching process in forming the lower wafer layer pattern of the die region, two Y-directional trenches 104a and two X-directional trenches 104b are formed in a part of the lower wafer layer 100. After the completion of the upper wafer layer, a lithograph process is performed to concurrently form the photoresist pattern of the die region and two X-directional and two Y-directional bar-like photoresist figures 106, which as a portion of the overlay mark.

By measuring the distance between the median line of the two Y-directional bar-like photoresist figures 106 and the median line of the two Y-directional trenches 104a, the alignment accuracy in the X-direction between the lithograph process and the pattern defined by the first exposure step can be determined. By measuring the distance between the median line of the two X-directional bar-like photoresist figures 106 and the median line of the two X-directional trenches 104b, the alignment accuracy in the Y-direction between the lithograph process and the pattern defined by the second exposure step can be determined. However, according to such an approach, the alignment accuracy in the Y-direction between the lithograph process and the pattern defined by the first exposure step and the alignment accuracy in the X-direction between the lithograph process and the pattern defined by the second exposure step can not be determined. Hence, this type of overlay marks on determining alignment is not completely effective.

Moreover, if the abovementioned four trenches are all defined in the first (or the second) exposure step, the alignment accuracy in the X-direction and in the Y-direction between the lithograph process and the patterns defined by the first (or the second) exposure step can be estimated. However, it is unable to estimate the alignment accuracy of between the lithograph process and the patterns defined by the second (or the first) exposure process. In order to be able to estimate the alignment accuracy in the X-direction and the Y-direction between the patterns defined in the first and the second exposure process respectively with the lithography process, the above-mentioned four trenches are defined in the first exposure step and another four trenches are defined in another part of the low wafer layer during the second exposure step. However, such an arrangement increases the area occupied by the overlay mark by two times.

Additionally, regardless of which type of the overlay mark, it is unable to estimate the alignment accuracy in the X-direction and in the Y-direction between the low wafer pattern defined in the first exposure and the low wafer pattern defined in the second exposure.

SUMMARY OF THE INVENTION

The present invention is to provide an overlay mark, used in checking the alignment accuracy between a lower wafer layer defined by two exposure steps and a lithograph process for defining an upper wafer layer.

The present invention is to provide a method for checking alignment accuracy, wherein the above-mentioned alignment marked is formed to check the alignment accuracy between a lower wafer layer defined by two exposure steps and a lithograph process for defining an upper wafer layer.

In the disclosure below, the terms "the first" and "the second" refer to different objects or processes/steps, and does not necessary imply the order of application or processing. For example, the first exposure step may perform before or after the second exposure step.

The alignment mark of the present invention includes a part of a lower wafer layer and an upper photoresist pattern. The part of the lower wafer layer includes two first X-directional, two first Y-directional bar-like figures, two second X-directional and two second Y-directional bar-like figures. The first X-directional, Y-directional figures are defined in the first exposure step to form a first rectangular frame. The second X-directional, Y-directional figures are defined in the second exposure step to define a second rectangular frame. The X-directional dimension $D_{2x}$ of the second rectangular frame is greater than the X-directional dimension $D_{1x}$ of the first rectangular frame, while the Y-directional dimension $D_{2y}$ of the second rectangular frame is smaller than the Y-directional dimension $D_{1y}$ of the first rectangular frame. The previously mentioned photoresist pattern, which configured above the part of the lower wafer layer and formed in the previous lithograph process, is surrounded by the above-mentioned bar-like figures. The lower wafer layer and the lithograph process are completely aligned when the crossover point between the median line of the two first X-directional bar-like figures and the median line of the two first Y-directional bar-like figures, the crossover point between the median line of the two second X-directional bar-like figures and the median line of the two second Y-directional bar-like figures and the center point of the photoresist pattern are completely aligned.

In one embodiment, the relationship between the above $D_{1x}$, $D_{1y}$, $D_{2x}$, $D_{2y}$, can be $D_{1x}=D_{2y}<D_{2x}=D_{1y}$.

In one embodiment, the width of each first X-directional bar-like figure is different from the width of each second X-directional bar-like figure, and the width of each first Y-directional bar-like figure is different from the width of each second Y-directional bar-like figure.

In one embodiment, the above two first X-directional and two first Y-directional bar-like figures are connected to each other, and the above two second X-directional and two second Y-directional bar-like figures are connected to each other. In another embodiment, the above two first X-directional and two first Y-directional bar-like figures are not connected to each other, and the above two second X-directional and two second Y-directional bar-like figures are not connected to each other.

In one embodiment, the above photoresist pattern includes one solid rectangular photoresist figure. In another embodiment, the above photoresist pattern includes two X-directional and two Y-directional photoresist figures, defining a third rectangular frame.

In one embodiment, the bar-shape figures of the part of the lower wafer layer are line figures or trenches formed in the part of the lower wafer layer.

In one embodiment, the above first and second exposure steps belong to a same lithograph process to constitute a double exposure process. In another embodiment, the two exposure steps respectively belong to two lithograph processes to define different photoresist layers.

In one embodiment, in one of the first and the second exposure steps, an X-dipole off-axis light source is applied, while in one of the other first and second exposure steps, a Y-dipole off-axis light source is applied. In another embodiment, the above first and second exposure steps concurrently use a plurality of figures, for example, a plurality of line figures and a plurality of trenches, that are defined in the low wafer layer with a pitch smaller than the resolution of each exposure step.

In another embodiment, the above first and second exposure steps concurrently use a plurality parallel lines defined with a pitch smaller than the resolution of each exposure step, and ends of conductive lines are connected to a plurality of contact pads, wherein each of the first and the second exposure steps respectively defines a part of the conductive lines and a part of the contact pads. Each contact pad is connected to one conductive line, wherein the contact pad is wider than the conductive line. The two neighboring contact pads that are respectively connected with the two conductive lines are arranged in an alternating manner along the direction of the conductive line extension, to avoid the two neighboring contact pads being overlapped.

According to a method of checking alignment accuracy of the present invention, the overlay mark described above is formed. Then, a plurality of positional parameters of the above-mentioned photoresist pattern in correspondence to the various bar-like figures of the lower wafer layer are determined to estimate at least one of the X-directional and the Y-directional alignment accuracies between lower wafer layer defined by the first exposure step and the lithograph process, and the X-directional and the Y-directional alignment accuracies between lower wafer layer defined by the second exposure step and the lithograph process. Forming the overlay mark includes, during the definition of the lower wafer layer, forming the above-mentioned two first X-directional and two first Y-directional bar-like figures defined in the first exposure step in one part of the lower wafer layer and the above-mentioned two second X-directional and two second Y-directional bar-like figures defined in the second exposure step. Further, during the lithograph process, forming the above-mentioned photoresist pattern in the part of the lower wafer layer.

The above method of checking the alignment accuracy further includes determining one positional parameter of the first X-directional bar-like figure in correspondence to the second X-directional bar-like figure to estimate the Y-directional accuracy and the X-directional accuracy between the lower wafer layer defined in the first exposure step and the lower wafer layer defined in the second exposure step.

Moreover, when the above-mentioned photoresist pattern includes a solid rectangular frame photoresist figure, the above method of checking the alignment accuracy includes determining the various positional parameters of the four sides of the rectangular frame photoresist figure in correspondence to the various bar-like figures of the part of the lower wafer layer. When the photoresist pattern includes two X-directional and two Y-directional bar-like photoresist figures that define a third rectangular frame, the above method of checking alignment accuracy determines a plurality of positional parameters of two X-directional and two Y-directional bar-like photoresist figures in correspondence to each of the above-mentioned bar-like figures.

Using the overlay mark of the invention, the alignment accuracy in the X-direction and Y-direction between the lower wafer layer defined in the first exposure step and the upper wafer layer defined in the subsequent lithograph process, and the alignment accuracy in the X-direction and the Y-direction between another part of the lower wafer layer pattern defined by the second exposure step and the upper wafer layer pattern can be checked. Additionally, the alignment accuracy between the lower wafer layer pattern defined by the first exposure step and the lower wafer pattern defined by the second exposure step can also be checked to provide a complete checking of the alignment accuracy.

In order to make the aforementioned and other objects, features and advantages of the present invention comprehensible, a preferred embodiment accompanied with figures is described in detail below.

DESCRIPTION OF EMBODIMENTS

Figure 2:
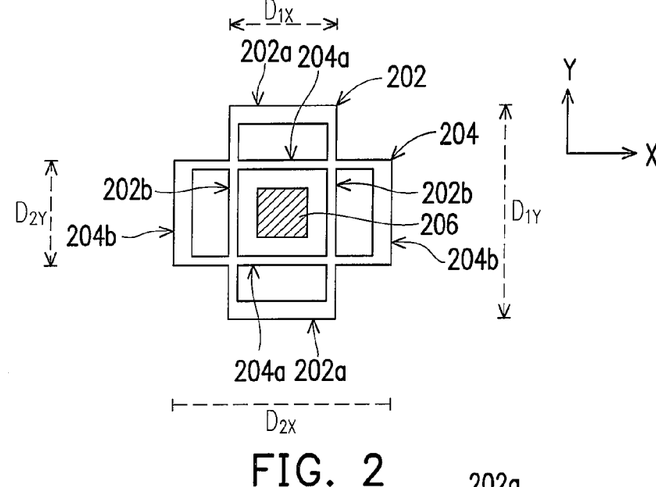
FIGS. 2-4 are schematic diagrams illustrating an overlay mark according three embodiments of the present invention.
Figure 3:
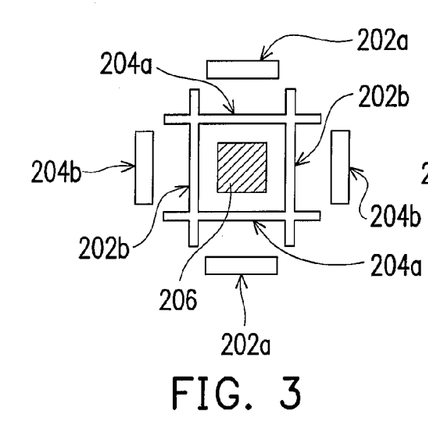
Figure 4:
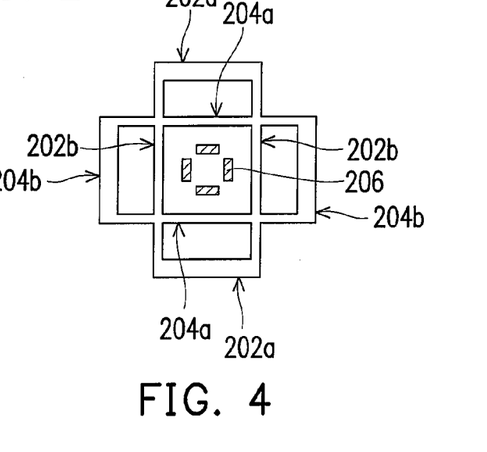

FIGS. 2 to 4 are respectively schematic diagrams of an overlay mark according three embodiments of the invention. The overlay mark is used to check the alignment accuracy between the first, the second exposure steps for defining a lower wafer layer and a lithograph process for defining an upper wafer layer.

Referring to FIG. 2, the overlay mark includes a part of the lower wafer layer and the photoresist pattern 206 on the upper wafer layer (not shown) that is above the part of the lower wafer layer. The part of the lower wafer layer includes two first X-directional bar-like figures 202a, two first Y-directional bar-like figures 202b, two second X-directional bar-like figures 204a and two second Y-directional bar-like figures 204b. The first X-directional bar-like figures 202a and the first Y-directional bar-like figures 202b are defined by the first exposure step to define a first rectangular frame 202. The two X-directional bar-like figures 204a and the two Y-directional bar-like figures 204b are defined by the second exposure step to define a second rectangular frame 204, wherein the X-directional dimension $D_{2x}$ of the second rectangular frame 204 is greater than the X-directional dimension $D_{1x}$ of the first rectangular frame 202, while the X-directional dimension $D_{2y}$ of the second rectangular frame 204 is smaller than the Y-directional dimension $D_{1y}$ of the first rectangular frame 202.

The photoresist pattern 206 is surrounded by the bar-like figures 202a, 202b, 204a, 204b, which are formed by the above lithograph processes. The pre-determined arrangement of the photoresist pattern 206 and the bar-like figures 202a, 202b, 204a, 204b are as follows: when the lower wafer layer is completely aligned with the lithograph process, the crossover point between the median line of the two first X-directional bar-like figures 202a and the median line of the two first Y-direction bar-like figures 202b, the crossover point between the median line of the two second X-direction bar-like figures 204a and the median line of the two second Y-direction bar-like figures 204b, and the center point of the photoresist pattern 206 overlap each other.

The relationships between the four values $D_{1x}$, $D_{1y}$, $D_{2x}$, $D_{2y}$ are, for example, $D_{1x}=D_{2y}<D_{2x}=D_{1y}$. Moreover, the width of the first X-directional bar-like figures 202a is different from that of the second X-directional bar-like figure 204a, and the width of the first Y-directional bar-like figure 202b is also different from that of the second Y-directional bar-like figure 204b. Hence, the checking of alignment accuracy is facilitated by differentiating between 202a and 204a, and between 202b and 204b.

Moreover, the above-mentioned bar-like figures 202a, 202b, 204a and 204b are for example, trenches formed in the part of the lower wafer layer or line figures that formed in the part of the lower wafer layer. When the lower wafer layer is a dielectric layer and the bar-like figures 202a, 202b, 204a and 204b are trenches formed in the part of the lower wafer layer, the upper wafer layer is, for example, a conductive layer. The position of each trench can be detected by changes of the optical refractive intensity. When the lower wafer layer is a conductive layer and the bar-like figures 202a, 202b, 204a, 204b are line figures and the upper wafer layer is, for example, a dielectric layer, the position of each line figure can also be detected by changes of the optical refractive intensity.

Additionally, in this embodiment, the first X-directional bar-like figures 202a and the first Y-directional bar-like figures 202b are connected to each other; the second X-directional bar-like figure 204a and the second Y-directional bar-like figure 202b are connected to each other. Further, the photoresist pattern 206 includes a solid rectangular frame photoresist figure. The application of this overlay mark can be exemplary illustrated by the estimation of the alignment accuracy in the Y-direction between the lower wafer pattern defined by the first exposure step and the lithograph process as described in the following. An optical method (for example, a detection of the changes in the intensity of the refractive light) is first used to detect each position of the two first X-direction bar-like figures 202a and the position of each of the top and bottom sidelines of the photoresist pattern 206. Then, based on the results, the position of the median line between the two first X-direction bar-like figures 202a and the position of the median line between the top and the bottom side lines of the photoresist pattern 206 are calculated, and the difference between the two positions is the estimated value.

Additionally, the alignment accuracy in the X-direction and in the Y-direction between the lower wafer pattern defined by the first exposure step and the lower wafer pattern defined by the second exposure step can also be estimated using this overlay mark. Using the Y-direction alignment accuracy as an example, the method of estimation is described as in followings. First, each position of the two first X-directional bar-like figures 202a and the two second X-direction bar-like figures 204a are detected. Based on the results, the position of the median line of the two first X-directional bar-like figures 202a and the position of the median line of the two second X-directional bar-like figures 204a are calculated, and the difference between the two values is the desired estimated value.

In other embodiments, the bar-like figures 202a and 202b that are concurrently defined may not be connected to each other, and the bar-like figures 204a and 204b that are concurrently defined may not be connected to each other as shown in FIG. 3. Further, the photoresist pattern 206 can also include two X-directional and two Y-directional bar-like photoresist figures that can define a third rectangular frame, as shown in FIG. 4.

When the photoresist pattern 206 includes two X-directional and two Y-directional bar-like photoresist figures, the calculation method is conducted as in the following using the alignment accuracy in the Y-direction between the lower wafer layer pattern defined by the first exposure step and the lithograph process as an example. An optical method is first used to detect each position of the two first X-directional bar-like figures 202a and the two X-directional bar-like photoresist figures. Based on the results, the position of the median line of the two first X-direction bar-like figures 202a and the position of the median line of the two X-direction bar-like photoresist figures are calculated. The difference between the two values is the desired estimated value.

Figure 5A:
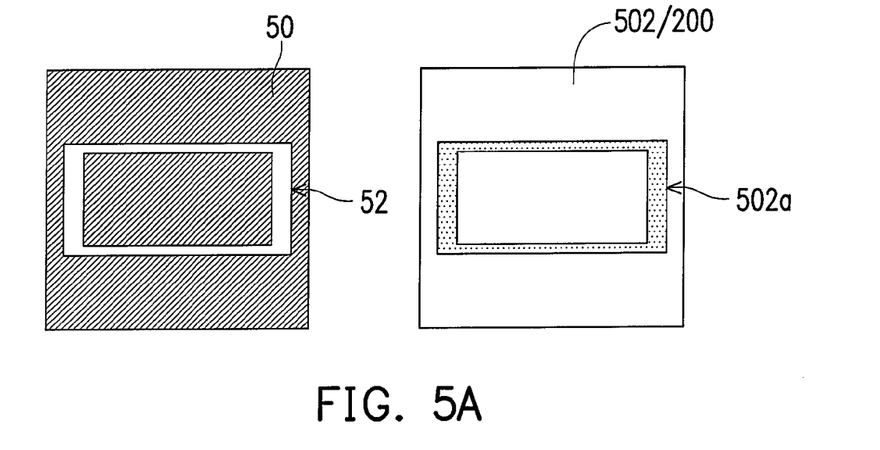
FIGS. 5A to 5C are—top view diagrams showing selected process steps in fabricating the overlay mark shown in FIG. 2 according to one embodiment, wherein each bar-like figure is a trench formed in the lower wafer layer.
Figure 5B:
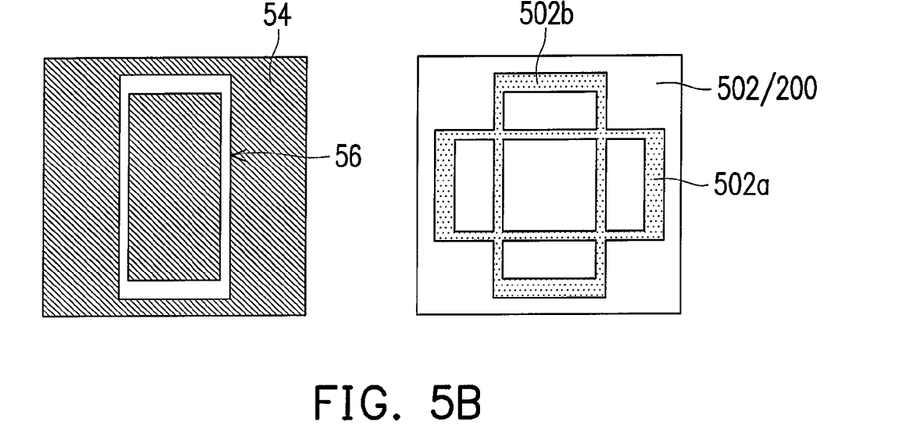
Figure 5C:
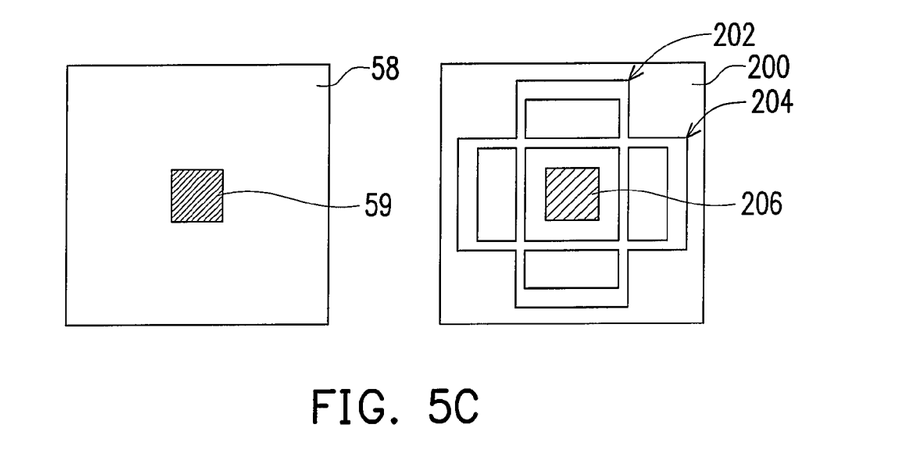

FIGS. 5A to 5C are top view diagrams showing selected process steps for fabricating the overlay mark as shown in FIG. 2 according to one aspect of the invention, wherein each bar-like figure is a trench fabricated in the lower wafer layer. Further, the second exposure step is performed before the first exposure step. Referring FIG. 5A, the lower wafer layer 200 is already formed with a positive photoresist layer 502. Referring simultaneously to both FIGS. 5A and 2, the second photomask used in the second exposure step also includes a trench pattern 52, which corresponds to a part of the non-die region and is used for defining the second X-directional bar-like figure 204a and the second Y-directional bar-like figure 204b, in addition to the part of the pattern (not shown) of the second photomask 50 that corresponds to the die region Accordingly, in the second exposure step, not only the pre-determined pattern is transferred to the die region (not shown), a rectangular ring-like exposure region 502a, which corresponds to the bar-like figures 204a and 204b, is also formed in positive photoresist layer 502 of a part of the non-die region.

Referring to both FIGS. 5B and 2, not only the first photomask 54 used in the first exposure step includes a pattern (not shown) that corresponds to the die region, it also includes a trench pattern 56, which corresponds to the part of the non-die region, for defining the first X-direction bar-like figures 202a and the first Y-direction bar-like figures 202b. Accordingly, in the first exposure step, not only the pre-determined pattern is transferred to the die region (not shown), the rectangular ring-like exposure region 502b that corresponds to the bar-like figures 202a and 202b is also formed in the photoresist layer 502.

The photoresist material in the rectangular ring-like exposure regions 502a and 502b and the exposure region in the die region are concurrently removed in the subsequent lithograph process. Therefore, in the subsequent etching process for forming the lower wafer pattern of the die region, the corresponding two rectangular ring-like trenches 202, 204 are formed in a part of the lower wafer layer 200 of the non-die region as shown in FIG. 5C.

Referring to FIG. 5C, after forming the upper wafer layer (not shown), a lithograph process is performed using a mask 58, wherein the mask 58 also includes the pattern 59, which corresponds to the part of the non-die region for defining the photoresist pattern 206, in addition to the pattern (not shown) to be transferred to the upper wafer layer in the die region. Hence, in the lithograph process, not only the predetermined pattern is transferred to the die region, the photoresist pattern 206 is also formed over a part of the lower wafer layer 200, and the photoresist pattern 206 is surrounded by the rectangular ring-like trenches 202, 204 (trench type bar-like figures 202a, 202b, 204a, 204b).

Moreover, the overlay mark as shown in FIGS. 3 & 4 can also be fabricated using the above-mentioned methods, by correspondingly changing the shapes of the patterns 52/56 or pattern 59. Moreover, if the above lower wafer layer is defined using a negative photoresist layer, and the patterns 56 and 52 of the second photomask 50 for forming the overlay mark remain unchanged, the bar-like figures 202a/b and 204a/b that are formed are line figures, which constitute a part of the lower wafer layer of a portion of the overlay mark.

Additionally, the overlay mark of the present invention is applicable to a patterning process that includes two exposure steps on a same lower wafer layer, wherein the two exposure steps belong to, for example, the same lithograph process or two lithograph processes for exposing different photoresist layers. When the two exposure steps belong to the same lithograph process, the two exposure steps constitute the so-called double exposure process.

Figure 6A:
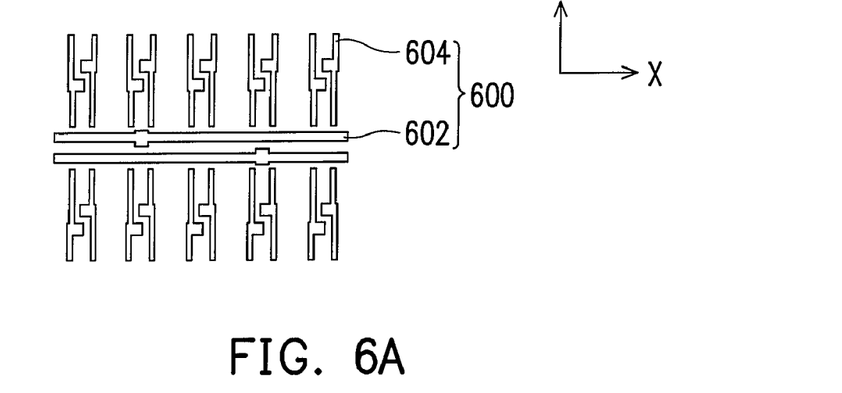
FIG. 6A is a diagram illustrating a process in which the overlay mark of the invention is applicable, for example, in a double exposure process using the X-dipole and the Y-dipole off axis light source as the exposure light for defining patterns.
Figure 6B:
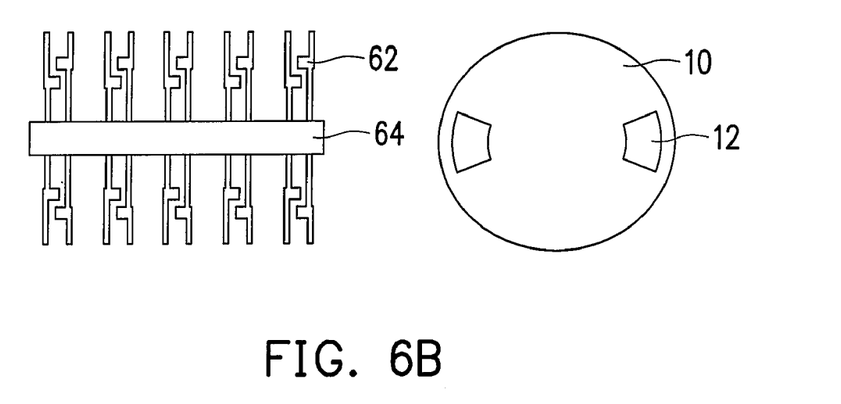
FIGS. 6B and 6C are schematic diagrams illustrating the corresponding photomask pattern in which the X-dipole polarized light source is used as the exposure light and the corresponding photomask pattern in which the Y-dipole polarized light source is used as the exposure light.
Figure 6C:
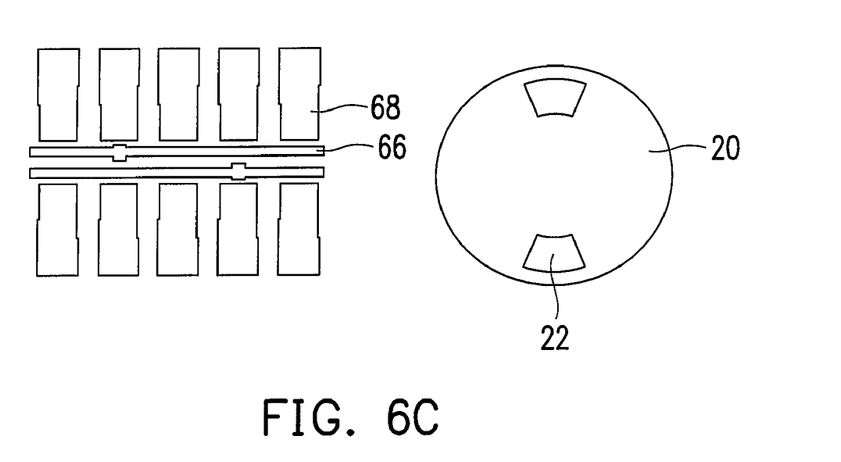

FIG. 6A is a schematic diagram illustrating a process in which the overlay mark of the invention is applicable, for example in a double exposure process using X-dipole, Y-dipole off-axis light source to define patterns. FIGS. 6B and 6C respectively illustrate the corresponding photomask pattern in which the X-dipole off axis light source exposure light is used and the corresponding photomask pattern in which the Y-dipole off axis light source exposure light is used. Referring to FIG. 6A, this exemplary pattern is a conductive line pattern 600 frequently seen in DARM device of poly circuit layer, wherein the X-directional dimension is essential to be accurately controlled. Hence, it is preferably that the X-dipole off-axis light source is used to define a part of the conductive line pattern 604. Further, the Y-directional dimension is also essential to be accurately controlled; and thus it is preferably that the Y-dipole off axis light source is used to define another part of the conductive line pattern 602. In this embodiment, corresponding to the upper wafer layer is a dielectric layer that covers the conductive line pattern 604. The pattern of the upper wafer layer is a pattern of a contact opening, and the lithograph process that includes the double exposure process uses a positive photoresist.

Referring to FIG. 6B, the X-dipole off-axis light source 10 includes two illumination regions 12 that are arranged along the X-direction using the axial line as a center of symmetry, the corresponding photomask that includes a pattern 62 corresponding to the part of the conductive line pattern 604, and a block pattern 64 that covers the pre-determinedly formed region of another part of the conductive line pattern 602. Referring to FIG. 6C, the Y-dipole off-axis light source 20 includes two illumination regions 22 that are arranged along the Y-direction using the axial line as a center of symmetry, the corresponding photomask that includes a pattern 66 corresponding to the other part of the conductive line pattern 602, and a block pattern 68 that covers the pre-determinedly formed region of the part of the conductive line pattern 604. These two photomasks are respectively used in the first and the second exposure steps. Further, in their corresponding regions of the non-die region, a portion of the pattern (not shown) of a part of the lower wafer layer that is used to define the previously described overly mark is formed, as shown in FIGS. 5A, 5B, for example. Moreover, the order of application of these two masks is not limited.

Figure 7A:
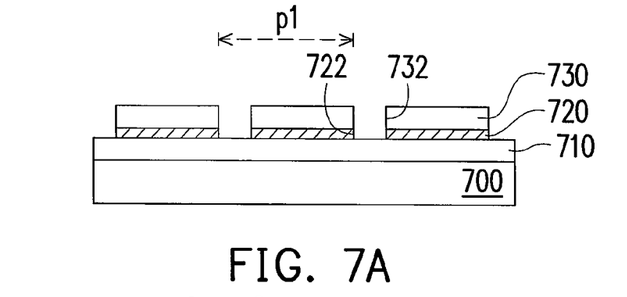
FIGS. 7A to 7C are schematic diagrams showing selected process steps of a fabrication process according to one embodiment of the invention, wherein the overlay mark of the present invention is applicable and the fabrication process is direct to forming a plurality of figures, in which the pitch between the figures is smaller than the resolution of each of the two exposures steps, and the plurality of figures is trenches.
Figure 7B:
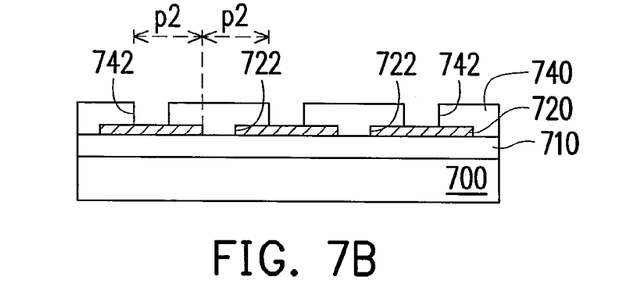
Figure 7C:
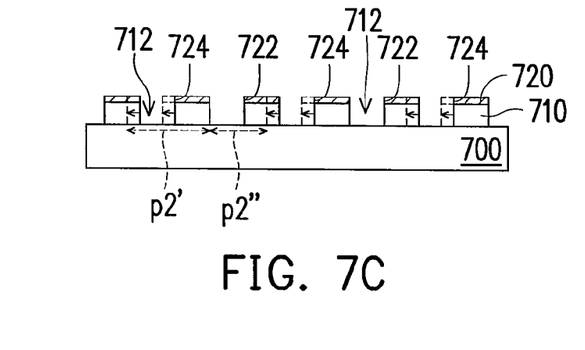

FIGS. 7A to 7C are schematic diagrams showing selected steps of a fabrication process according to one embodiment of the invention, wherein the overlay mark of the present invention is applicable and the fabrication process is direct to forming a plurality of figures, in which the pitch between the figures is smaller than the resolution of each of the two exposures steps. In this example, the two exposure steps respectively belong to two lithograph processes but for exposing different photoresist layers to define a plurality of figures to form trenches in the lower wafer layer.

Referring to FIG. 7A, after forming the lower wafer layer 710 and the hard mask layer 720 over the substrate 700, a first lithograph process which includes a first exposure step is performed to form a patterned photoresist layer 730 having trench patterns 732. The pitch of the neighboring trench patterns has a value p1, which can be achieved by the resolution of each of the two exposure steps. Using the photoresist layer 730 as a mask, the hard mask layer 720 is etched to form the trench patterns 722 having a pitch of p1.

Referring to FIG. 7B, after removing the photoresist layer 730, a second lithograph process including a second exposure step is performed to form a patterned photoresist layer 740 that includes trench patterns 742 having a pitch of p1. The pitch between one of the trench patterns 742 and the trench pattern 722 in the neighboring hard mask layer 720 is p2, which is half of the value of p1 and is non-achievable by each resolution of the two exposure steps.

Referring to FIG. 7C, using the photoresist layer 740 as a mask, the hard mask layer 720 is etched to form the trench patterns 724, wherein the pitch between one trench pattern 724 and its neighboring trench pattern 722 is p2. After the photoresist layer 740 is removed, the lower wafer layer 710 is etched to form a plurality of trenches 712 having a pitch of p2 by using the hark mask layer 720 having the trench patterns 722 and 724 as a mask.

Figure 8A:
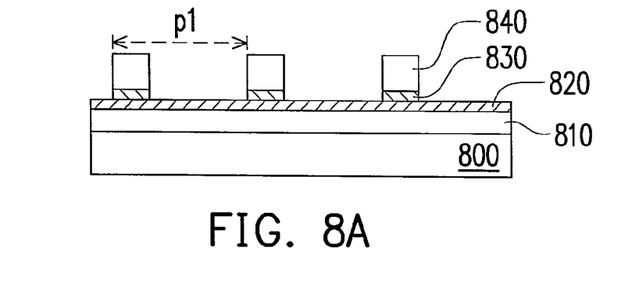
FIGS. 8A to 8C are schematic diagrams showing selected process steps of a fabrication process according to one embodiment of the invention, wherein the overlay mark of the present invention is applicable and the fabrication process is direct to forming a plurality of figures, in which the pitch between the figures is smaller than the resolution of each of the two exposures steps, and the plurality of figures is a plurality of line figures.
Figure 8B:
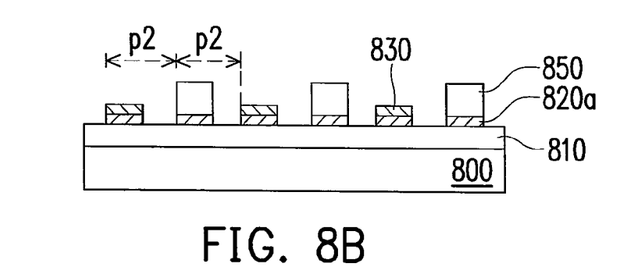
Figure 8C:
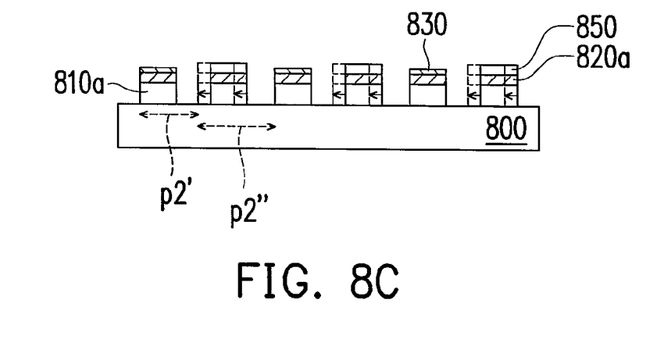

FIGS. 8A to 8C are schematic diagrams showing selected steps process of a fabrication process according to another embodiment of the invention, wherein the overlay mark of the present invention is applicable, and the fabrication process is directed to forming a plurality of figures, in which the pitch between the figures is smaller than the resolution of each of the two exposures steps.

Referring to FIG. 8A, the lower wafer layer 810, the first hard mask layer 820 and the second hard mask layer 830 are sequentially formed on the substrate 800. Thereafter, a first lithography process that includes the first exposure step is performed to form a patterned photoresist layer having a plurality of line figures, wherein the line figures have a pitch of p1 that is achievable by each resolution of the two exposure steps. However, using the photoresist layer 840 as an etching mask, the second hard mask layer 830 is etched to form a plurality of corresponding line figures.

Referring to FIG. 8B, after removing the photoresist layer 840, a second lithograph process that includes a second exposure step is performed to form a patterned photoresist layer 850 having a plurality of lines figures. Further, the pitch between one of line figures and the line figure of its neighboring second hard mask layer 830 is p2, which is one half of the value of p1, and is non-achievable by each resolution of the two exposure steps. Thereafter, using the patterned photoresist layer 850 and the patterned second hard mask layer 830 as a mask, the first hard mask layer 820 is etched to form a patterned hard mask layer 820a, which includes a plurality line patterns having a pitch of p2.

Referring to FIG. 8C, using the patterned first hard mask layer 820a, the patterned second hard mask layer 830 and photoresist layer 850 as a mask for etching the lower wafer layer 810, a plurality of line figures 810 a pitch of p2 is defined.

In the two embodiments illustrated in FIGS. 7A to 7C and 8A to 8C, in the first and the second exposure steps, two photomasks are respectively used to form, in the corresponding regions of the non-die region, a part of the lower wafer layer pattern used in defining a part of the above-described overlay mark, as illustrated in FIGS. 5A and 5B. Further, the order of the application of these two photomasks is not limited.

If the designated position of the second exposure step of the second lithograph process is displaced, as illustrated by the dotted line, the plurality of trenches 712 or the plurality of line FIGS. 810a will have two pitches p2' or p2", as shown in FIG. 7C or FIG. 8C. The application of the overlay mark of the present invention under this kind of displacement condition is described as follows. Referring to FIG. 2, when the first rectangular frame 202 of the overlay mark is defined by the first exposure step, the second rectangular frame 204 is defined by the second exposure step, and the above displacement direction is in the X-direction, the second rectangular frame 204 also displaces with a same distance in the X-direction. Hence, the displacement of the designated position in the second exposure step can be obtained.

Figure 9A:
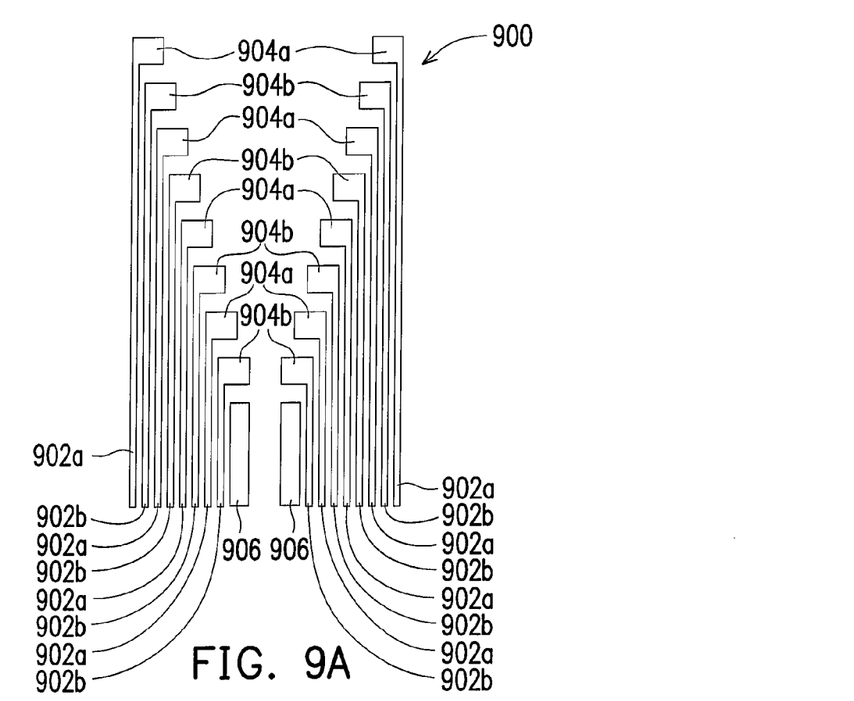
FIG. 9A is a diagram illustrating a fabrication process according to another embodiment of the invention, wherein the overlay mark of the invention is applicable and the fabrication process is directed to defining a pattern using two exposure steps.
Figure 9B:
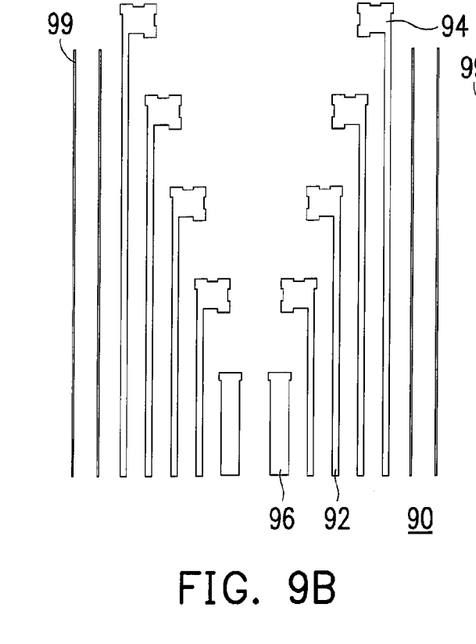
FIGS. 9B and 9C are schematic diagrams of the photomasks respectively used in the two exposure steps.
Figure 9C:
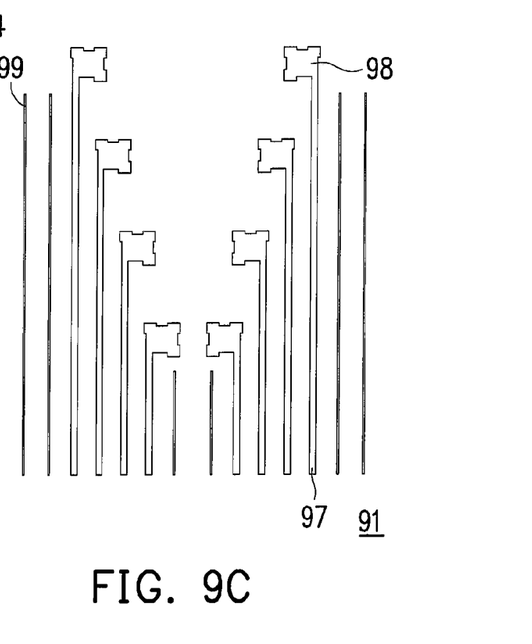

FIG. 9A illustrates a fabrication process, according to another embodiment of the invention, wherein the overlay mark of the present invention is applicable, and wherein two exposure steps are used to define a pattern. FIGS. 9B and 9C respectively illustrate the photomask patterns used respectively in the two exposure steps. In this embodiment, the two exposure steps respectively belong to two lithography processes to expose different photoresist layers and to pattern the entire lower wafer layer as shown in FIGS. 8A to 8C.

Referring to FIG. 9A, the pattern 900 includes patterns of conductive lines and patterns of the contact pad, which includes a plurality of parallel conductive lines 902a/b having a pitch smaller than each resolution of the two exposure steps, and a plurality of contact pads 904a/b that are connected to the ends of these conductive lines, wherein one contact pad 904 is connected to one conductive line and the width of the contact pad is wider that that of the conductive line. Moreover, the two neighboring contact pads 904a and 904b that are respectively connected to two neighboring conductive lines 902a and 902b are arranged in an alternating manner in the direction along the conductive line extension, to avoid the two neighboring contact pads being overlapped.

Since the pitch of the conductive lines 902a/b is smaller than each resolution of the two exposure steps, a part of the conductive lines 902a and the contact pads 904a connected thereto are fabricated on the photomask used in the first exposure step, while the other part of the conductive lines 902b and the contact pads 904b connected thereto are fabricated on another photomask used in the second exposure step. The conductive lines 902a and the conductive lines 902b are alternatively arranged to double the pitch between patterns in any mask such that the patterns are transferred under the allowable resolution of the exposure step. Further, because the conductive line 906 is close to the conductive line 902b, the pattern of the conductive line 906 and the patterns of the conductive lines 902a and the contact pads 904a can be fabricated on a same photomask.

Referring to FIG. 9B, the photomask 90 used in the first exposure step includes the pattern 92 used for defining the conductive lines 902a, and the pattern 94 connected to the pattern 92 and used in defining the conductive lines 902b, and the pattern 96 used in defining the conductive lines 906. Referring to FIG. 9C, the mask used in the second exposure step include the pattern 97 used in defining the conductive lines 902b, and the pattern 98 connected to the pattern 97 and used in defining the contact pads 904b. Each photomask may also include some auxiliary patterns 99 and optical proximity correction (OPC) to define the conductive lines 902a, 906 and the contact pads 904a with better images.

In the above first and second exposure steps, the two photomasks 90 and 91 are respectively used, at regions of the corresponding non-die region to form the pattern used to define a part of the lower wafer layer of one part of the overlay mark, as shown in FIGS. 5A, 5B. Further, the order of application of these two photomasks 90 and 91 is not limited.

As described in the above embodiments, using the overlay mark of the invention, the alignment accuracy in the X-direction and Y-direction between the lower wafer layer pattern defined in the first exposure step and the wafer layer defined in the subsequent lithograph process, and the alignment accuracy in the X-direction and the Y-direction between the lower wafer layer pattern defined in the second exposure step and the upper wafer layer pattern can be checked. Additionally, the alignment accuracy between the lower wafer layer defined by the first exposure step and the lower wafer pattern defined by the second exposure step can also be checked to provide a complete and effective checking of the alignment accuracy.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. An overlay mark, used in checking alignment accuracy between a lower wafer layer defined by a first exposure step and a second exposure step and a lithograph process used in defining one upper wafer layer, the overlay mark comprising:
   a part of the lower wafer layer including two first X-directional bar-like figures, two first Y-directional bar-like figures, two second X-directional bar-like figures and two second Y-directional bar-like figures;
   the two first X-directional and the two first Y-directional bar-like figures defined by the first exposure step to form a first rectangular frame;
   the two second X-directional and the two second Y-directional bar-like figures defined by the second exposure step to form a second rectangular frame, wherein an X-directional dimension $D_{2x}$ of the second rectangular frame is greater than an X-directional dimension $D_{1x}$ of the first rectangular frame, while a Y-directional dimension $D_{2Y}$ of the second rectangular frame is smaller than a Y-directional dimension $D_{1Y}$ of the first rectangular frame;
   a photoresist pattern, configured above a part of the lower wafer layer, surrounded by the bar-like figures, and formed by the lithograph process; and
   the lower wafer layer is completely aligned with the lithograph process when a first crossover point, a second crossover point and a center point of the photoresist pattern overlap with each other, wherein the first crossover point is an intersection between a median line of the two first X-directional bar-like figures and a median line of the two second X-directional bar-like figures, the second crossover point is an intersection between a median line of the two first Y-directional bar-like figures and a median line of the two second Y-directional bar-like figures.

2. The overlay mark of claim 1, wherein a relationship between the X-directional dimensions and the Y-directional dimensions $D_{1x}$, $D_{2x}$, $D_{1y}$, $D_{2y}$ includes $D_{1x}=D_{2y}<D_{2x}=D_{1y}$.

3. The overlay mark of claim 1, wherein a width of each of the first X-directional bar-like figures is different from a width of each of the second X-directional bar-like figures, and a width of each of the first Y-directional bar-like figures is different from a width of each of the second Y-directional bar-like figures.

4. The overlay mark of claim 1, wherein the two first X-directional and the two first Y-directional bar-like figures are connected to each other, and the two second X-directional and the two second Y-directional bar-like figures are connected to each other.

5. The overlay mark of claim 1, wherein the two first X-directional and the two first Y-directional bar-like figures are not connected to each other, and the two second X-directional and the two second Y-directional bar-like figures are not connected to each other.

6. The overlay mark of claim 1, wherein the photoresist pattern includes a solid rectangular photoresist figure or two X-directional bar-like photoresist figures and two Y-directional bar-like photoresist figures for defining a third rectangular frame.

7. The overlay mark of claim 1, wherein the two first X-directional bar-like figures, the two second X-directional bar-like figures, the two first Y-directional bar-like figures and the two second Y-directional bar-like figures are line figures or trenches that are formed in the part of the lower wafer layer.

8. A method of checking alignment accuracy between a lower wafer layer defined by a first exposure step and a second exposure step and a lithography process used for defining an upper wafer layer, the method comprising:
   forming an overly mark;
   forming two first X-directional and two first Y-directional bar-like figures in a part of the lower wafer layer defined by the first exposure step, and two second X-directional and two Y-directional bar-like figures defined by the second exposure step during a definition of the lower wafer layer, wherein the two first X-directional and the two first Y-directional bar-like figures define a first rectangular frame, and the two second X-directional and the two second Y-directional bar-like figures define a second rectangular frame, wherein an X-directional dimension $D_{2x}$ of the second rectangular frame is greater than an X-directional dimension $D_{1x}$ of the first rectangular frame, while a Y-directional dimension $D_{2y}$ of the second rectangular frame is smaller than a Y-directional dimension $D_{1y}$ of the first rectangular frame;
   forming a photoresist pattern over the part of the lower wafer layer during the lithograph process, wherein the photoresist pattern is surrounded by the bar-like figures, and when the lower wafer layer is completely aligned with the lithograph process, a crossover point between a median line of the two first X-directional bar-like figures and a median line of the two first Y-directional bar-like figures, a crossover point between a median line of the two second X-directional bar-like figures and a median line of the two second Y-directional bar-like figures and a center point of the photoresist pattern overlap with each other; and
   determining various positional parameters of each of the bar-like figures of the lower wafer layer in correspondence to the photoresist pattern to estimate at least one of an X-directional alignment accuracy and a Y-directional alignment accuracy between a pattern of the lower wafer layer defined by the first exposure step and the lithograph process, and an X-directional alignment and a Y-directional alignment accuracy between a pattern in the lower wafer layer defined by the second exposure step and the lithograph process.

9. The method for checking the alignment accuracy according to claim 8 comprising determining the positional parameter of the two first X-directional bar-like figures in correspondence to the two second X-directional bar-like figures and the positional parameter of the two first Y-directional bar-like figures in correspondence to the two second Y-directional bar-like figures to estimate the X-directional alignment accuracy and the Y-directional alignment accuracy between the pattern of the lower wafer layer defined by the first exposure step and the pattern of the lower wafer layer defined by the second exposure step.

10. The method for checking the alignment accuracy according to claim 8, wherein a relationship between the X-directional dimensions and the Y-directional dimensions $D_{1x}$, $D_{2x}$, $D_{1y}$, $D_{2y}$ includes $D_{1x}=D_{2y}<D_{2x}=D_{1y}$.

11. The method for checking the alignment accuracy according to claim 8, wherein a width of each of the first X-directional bar-like figures is different from a width of each of the second X-directional bar-like figures, and a width of each of the first Y-directional bar-like figures is different from a width of each of the second Y-directional bar-like figures.

12. The method for checking the alignment accuracy according to claim 8, wherein the two first X-directional and the two first Y-directional bar-like figures are connected to each other, and the two second X-directional and the two second Y-directional bar-like figures are connected to each other.

13. The method for checking the alignment accuracy according to claim 8, wherein the two first X-directional and the two first Y-directional bar-like figures are not connected to each other, and the two second X-directional and the two second Y-directional bar-like figures are not connected to each other.

14. The method for checking the alignment accuracy according to claim 8, wherein the photoresist pattern includes a solid rectangular photoresist figure, in which various positional parameters of four sides of the solid rectangular photoresist figure in correspondence to each of bar-like figures of the lower wafer layer are determined.

15. The method for checking the alignment accuracy according to claim 8, wherein the photoresist pattern comprises two X-directional and two Y-directional photoresist figures to define a third rectangular frame, in which various positional parameters of the two X-directional and the two Y-directional bar-like photoresist figures in correspondence to each of the bar-like figures of the lower wafer layer are determined.

16. The method for checking the alignment accuracy according to claim 8, wherein the bar-like figures are line figures or trenches that are formed in the part of the lower wafer layer.

17. The method for checking the alignment accuracy according to claim 8, wherein the first exposure step and the second exposure step belong to a same lithograph process to constitute a double exposure process.

18. The method for checking the alignment accuracy according to claim 8, wherein the first exposure step and the second exposure step belong to different lithograph processes for defining different photoresist layers.

19. The method for checking the alignment accuracy according to claim 8, wherein the first exposure step applies an x-dipole off-axis light source, while the second exposure step applies a y-dipole off axis light source or the first exposure step applies the y-dipole off-axis light source, while the second exposure step applies the x-dipole off-axis light source.

20. The method for checking the alignment accuracy according to claim 8, the first and the second exposure steps are concurrently performed to define two first X-directional bar-like figures, the two second X-directional bar-like figures, the two first Y-directional bar-like figures, and the two second Y-directional bar-like figures in the lower wafer layer having a pitch smaller than a resolution of each of the two exposure steps.

21. The method for checking the alignment accuracy according to claim 20, wherein the two first X-directional bar-like figures, the two second X-directional bar-like figures, the two first Y-directional bar-like figures, and the two second Y-directional bar-like figures include a plurality of line figures or a plurality of trenches.

22. The method for checking the alignment accuracy according to claim 8 comprising:
concurrently performing the first and the second exposure steps to define a plurality of parallel conductive lines having a pitch smaller than a resolution of each of the two exposure steps, and ends of the conductive lines being connected to a plurality of contact pads, wherein the first and the second exposure steps are performed within an acceptable resolution limit of each of the exposure steps to define a part of the conductive lines and a part of the contact pads;
connecting each of the contact pads with one of the conductive lines, wherein a width of the contact pad is greater than a width of the conductive line; and
connecting respectively two of the neighboring contacts to two of the neighboring conductive lines in an alternating manner in the direction along the conductive line extension, to preclude the two neighboring contact pads being overlapped.

* * * * *